(12) United States Patent
Dungan

(10) Patent No.: US 7,960,768 B2
(45) Date of Patent: Jun. 14, 2011

(54) 3D BACKSIDE ILLUMINATED IMAGE SENSOR WITH MULTIPLEXED PIXEL STRUCTURE

(75) Inventor: Thomas Edward Dungan, Fort Collins, CO (US)

(73) Assignee: Aptina Imaging Corporation, Grand Cayman (KY)

( * ) Notice: Subject to any disclaimer, the term of this patent is extended or adjusted under 35 U.S.C. 154(b) by 605 days.

(21) Appl. No.: 12/015,595

(22) Filed: Jan. 17, 2008

(65) Prior Publication Data

US 2009/0184349 A1    Jul. 23, 2009

(51) Int. Cl.
*H01L 31/062* (2006.01)

(52) U.S. Cl. ........ 257/292; 257/291; 257/293; 257/447; 257/E27.133

(58) Field of Classification Search .................. 257/291, 257/292, 293, 447, E27.133
See application file for complete search history.

(56) References Cited

U.S. PATENT DOCUMENTS

| | | | |
|---|---|---|---|
| 6,107,655 A | 8/2000 | Guidash | |
| 7,057,150 B2 | 6/2006 | Zarnowski et al. | |
| 7,087,883 B2 | 8/2006 | He et al. | |
| 2005/0185077 A1 | 8/2005 | Xiao | |
| 2006/0273241 A1 | 12/2006 | Guidash et al. | |
| 2007/0029465 A1 | 2/2007 | Choi et al. | |
| 2007/0069258 A1* | 3/2007 | Ahn | 257/290 |
| 2008/0083939 A1* | 4/2008 | Guidash | 257/292 |

OTHER PUBLICATIONS

Frank Niklaus et al., "Low-Temperature Wafer-Level Transfer Bonding", Journal of Microelectromechanical Systems, vol. 10, No. 4, Dec. 2001, pp. 525-531.

* cited by examiner

*Primary Examiner* — Tan N Tran
(74) *Attorney, Agent, or Firm* — RatnerPrestia

(57) ABSTRACT

A three-dimensional pixel array, a method of manufacturing a pixel array and an imager including the three-dimensional pixel array. The three-dimensional array includes multiple groups of pixels, each group of pixels including a first layer and a second layer. The first layer includes multiple photosensitive elements, one per pixel in the group, at least one floating diffusion region connected to each photosensitive element in the group via at least one respective transfer gate per pixel and multiple transfer gate lines, at least two transfer gate lines connected to each respective transfer gate in each row of pixels. The second layer includes at least a rest transistor per group and a source follower transistor coupled to the shared floating diffusion in the first layer.

16 Claims, 15 Drawing Sheets

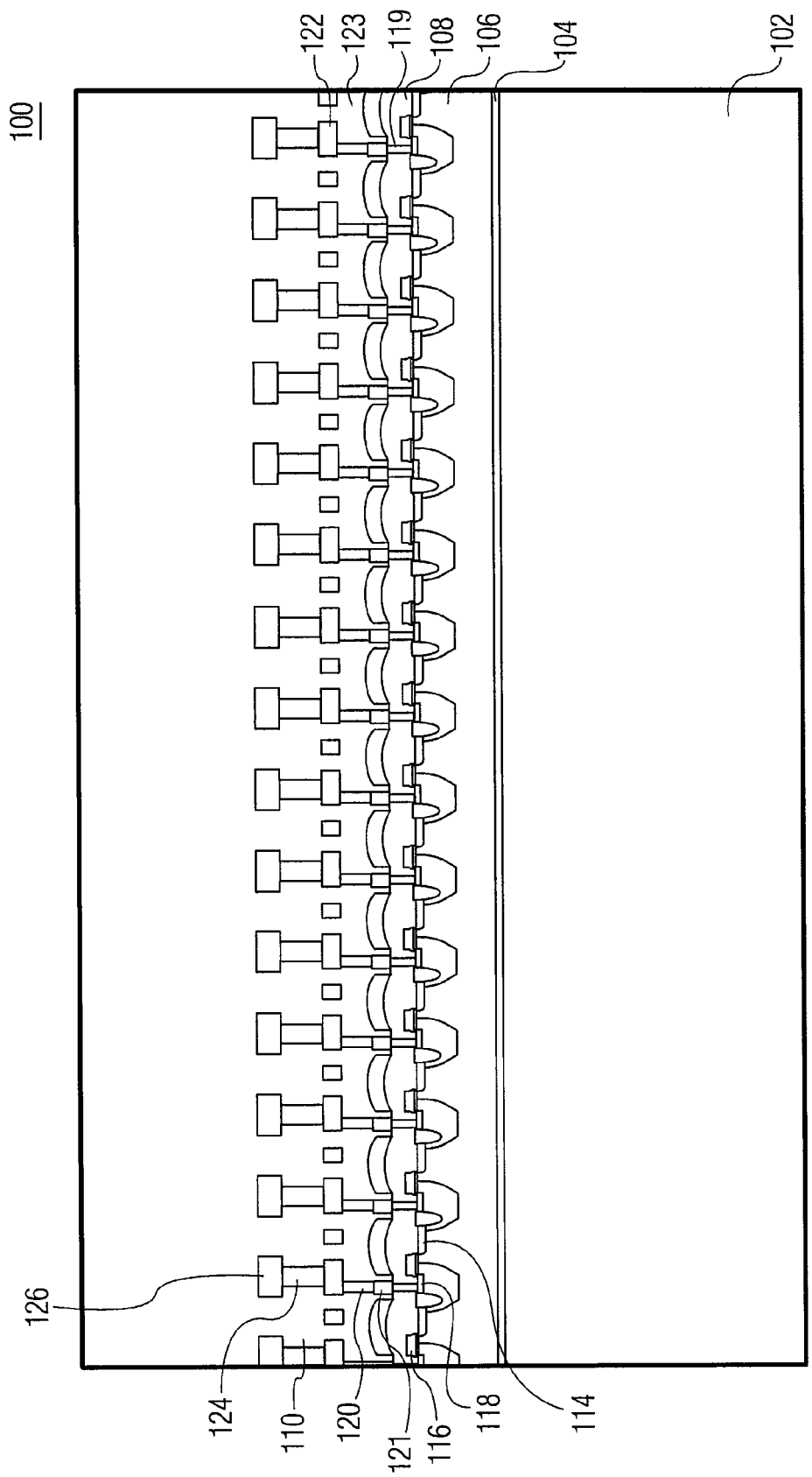

3D BACKSIDE ILLUMINATED IMAGE SENSOR WITH MULTIPLEXED PIXEL STRUCTURE

BACKGROUND OF THE INVENTION

Imagers, including complimentary metal oxide semiconductor (CMOS) imagers and charge-coupled devices (CCD), may be used in digital imaging applications to capture scenes. An imager includes an array of pixels. Each pixel in the array includes at least a photosensitive element for providing a signal having a magnitude proportional to the intensity of light incident on the photosensitive element. When exposed to incident light to capture a scene, each pixel in the array outputs a signal having a magnitude corresponding to an intensity of light at one point in the scene. The signals provided by all of the photosensitive elements may be processed to form an image representing the captured scene.

In one imager incorporating a 4T pixel structure, each pixel further includes a floating diffusion region for temporarily storing a signal from the photodiode, a reset transistor for resetting the floating diffusion region and the photodiode, a row select transistor for selecting a pixel for read out and a source follower transistor for reading out the level of the pixel.

In another imager incorporating a 4T pixel structure, each individual pixel may include only a photodiode and a transfer gate. The remaining elements may be shared amongst a plurality of pixels. That is, a plurality of pixels may share a common floating diffusion, reset transistor, source follower transistor and row select transistor. This is commonly known as pixel multiplexing. Some common multiplexed arrangements include 2-way, 3-way and 4-way multiplexed pixel arrays wherein 2 pixels, 3 pixels or 4 pixels, respectively, share the common transistors.

Pixel multiplexing may be desirable because it reduces the average number of transistors per pixel. For example, in a 2-way multiplexed pixel array, the average number of transistors per pixel is reduced from 4 transistors to 2.5 transistors. By way of another example, for the 4-way multiplexed pixel array, the average number of transistors per pixel is further reduced to 1.75 transistors per pixel. In this way, multiplexing pixels may serve to reduce the size of each pixel.

BRIEF DESCRIPTION OF THE DRAWINGS

Included in the drawings are the following figures:

FIG. 1A is a cross-sectional view of a photo-wafer completed through interconnect formation according to an example embodiment of the present invention.

DETAILED DESCRIPTION OF THE INVENTION

Figure 1B:
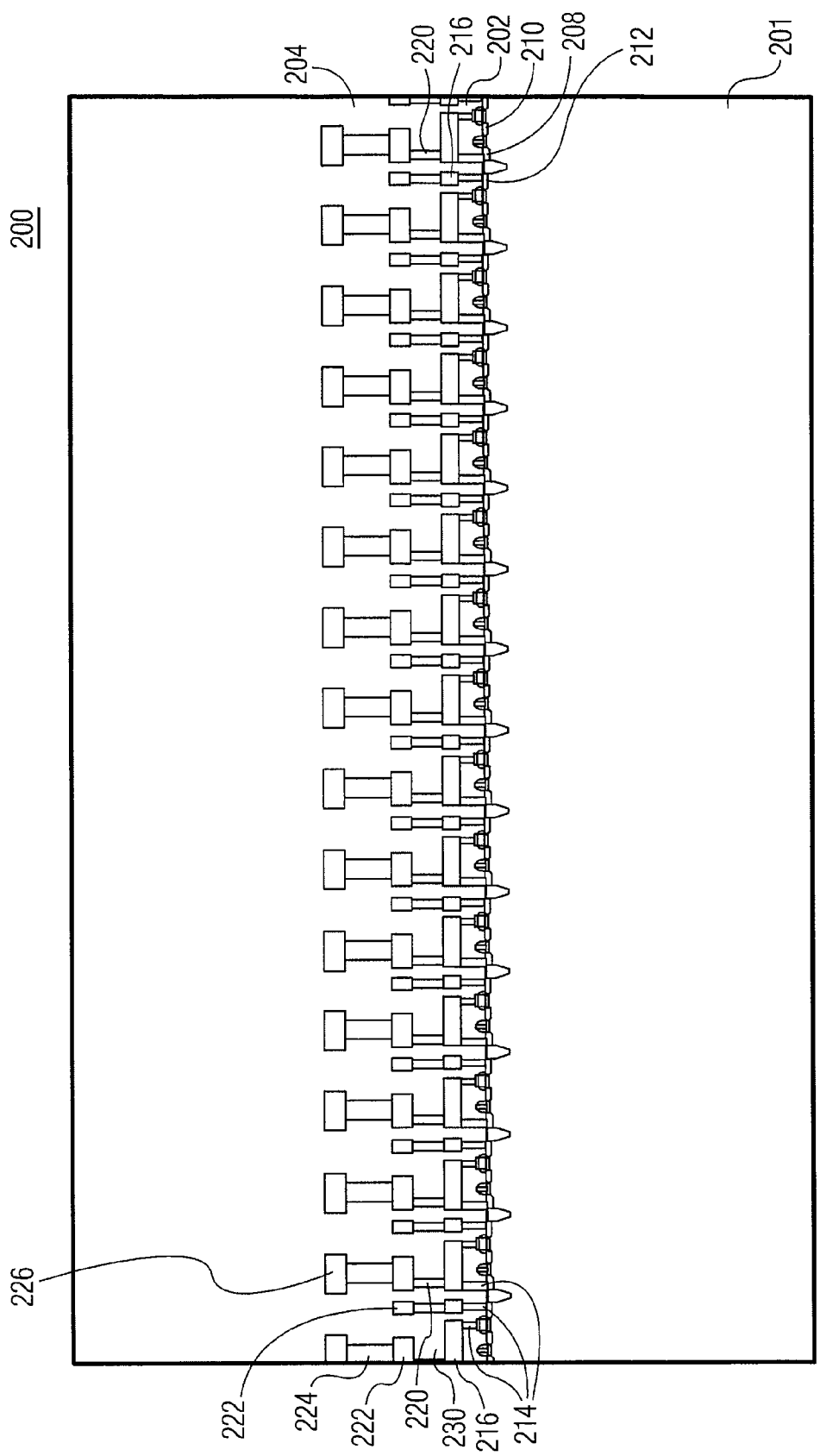
FIG. 1B is a cross-sectional view of a host wafer completed through interconnect formation according to the example embodiment of FIG. 1A.

A conventional image sensor can be described as "two-dimensional" because all of the pixel transistors and diodes are created at a single planar silicon surface. When several pixels are multiplexed in a conventional two-dimensional front-side-illuminated image sensor, the advantages from space savings due to transistor count reduction may be compromised by the need for additional transfer gate control lines or by difficulties in maintaining optical symmetry in the multiplexed structure. For example, when pixels from two different columns of the array are multiplexed together, an additional transfer gate line is typically routed horizontally along each row. For the two-dimensional front-side-illuminated image sensor, the transfer gate control lines are routed in interconnect metallization layers positioned between the pixel plane and the incident light. To minimize shadowing of the photodiodes, all such control and interconnect metal lines are routed along the adjacent pixel borders between photodiodes, where limited available space can make the addition of additional transfer gate control lines complicated. Multiplexing pixels in the same column does not require additional transfer gate lines along each row of pixels, however, when several pixels are multiplexed along a column, it becomes increasingly difficult to place and route the shared transistors in a way that does not disturb the optical symmetry that is desirable for uniform pixel photo response. For these reasons, two-dimensional front-side-illuminated image sensors are practically limited to multiplexing pixels from no more than two columns and no more than four rows together, with typical multiplexing limited to no more than four pixels (two rows and two columns, or four rows).

Embodiments of the present invention are directed to a multiplexed three-dimensional backside illuminated image sensor. Using this structure, the photodiodes may be positioned above the transfer gate lines and other interconnect metallization, facing the incident light. Relocating the interconnect metallization out of the optical path may substantially reduce optical interference and improve photocollection efficiency. Furthermore, this structure may reduce density requirements for both the interconnects and the associated transistors for a given pixel size. Further, the structure alleviates the requirement that transfer gate lines be routed along the pixel borders. In one embodiment described below, the structure frees room to add additional circuitry within the pixel itself.

FIGS. 1A-1F illustrate cross-sectional views of a three-dimensional backside illuminated image sensor according to an example embodiment of the present invention at successive stages of construction.

An example photo-wafer 100 completed through interconnect formation is shown in FIG. 1A. Example photo-wafer 100 includes substrate 102, buried etchstop 104 and photodiode layer 106. Photodiode layer 106 includes photodiodes 114 and floating diffusions 118. Photodiodes 114 and floating diffusions 118 may be formed in photodiode layer 106 by patterned implantation or diffusion of appropriate dopants into photodiode layer 106. Transfer gates 116 are formed in photodiode layer 106 between respective adjacent photodiodes 114 and floating diffusions 118. A first dielectric 108 is formed over photodiode layer 106.

Via holes 119, filled with metal from a first metal layer, are formed in first dielectric 108. Conductive traces 121 are disposed over respective via holes 119. A second dielectric 123 having via holes 120 filled with metal from a second metal layer is disposed over the first dielectric 108. Conductive traces 122 are disposed over respective via holes 120. A third dielectric layer 110, which may be a planarized dielectric, having via holes 124 filled with metal from a third metal layer is disposed over traces 122. Contact pads 126 are disposed over respective via holes 124.

While the embodiments of the invention are described in terms of three metal layers, it is contemplated that other types of conductors may be used, such as, for example, polysilicon. It is also contemplated that more than three conductive layers may be used.

FIG. 1A shows one contact pad 126 per pixel in the cross-sectional view. As will be described later, in a multiplexed pixel structure, one contact pad may be used to connect more than one pixel to the host wafer, reducing the required number of inter-wafer connections.

Next, a host wafer 200 may be formed. An example host wafer 200 completed through interconnect formation is shown in FIG. 1B. Host wafer 200 includes substrate 201. Transistors may be formed in substrate 201, including, for example, reset transistors 208, source follower transistors 210 and row select transistors 212. Interconnect structures may be formed over the transistors, by methods well known in semiconductor processing such as, for example, using either metal deposition and etch or damascene interconnect formation processes. Metal contact pads 226 may be used to connect the host wafer to the photo-wafer at a later step.

Figure 1C:
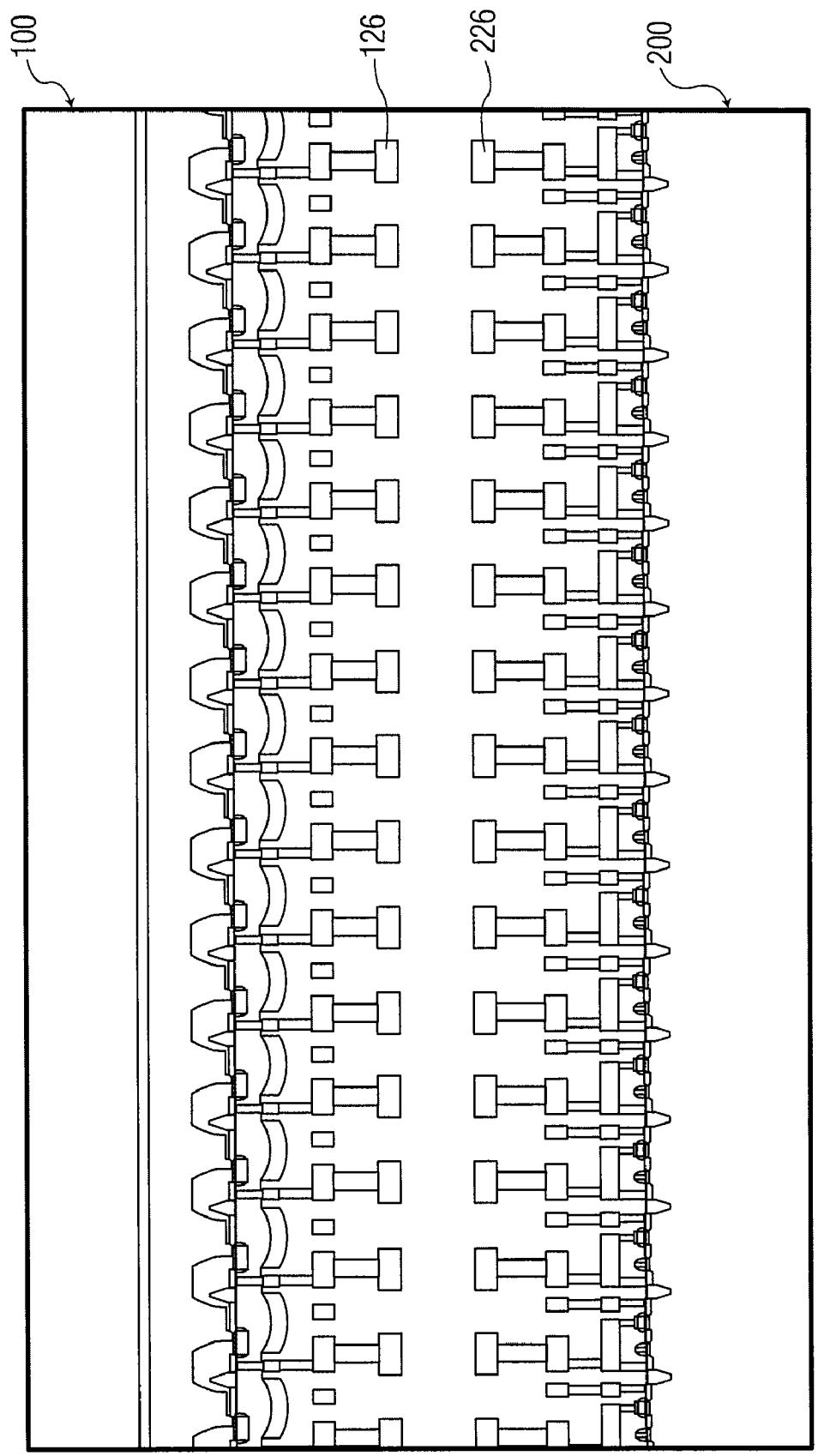
FIG. 1C is a cross-sectional view of the photo-wafer of FIG. 1A and the host wafer of FIG. 1B aligned for wafer to wafer bonding.
Figure 1D:
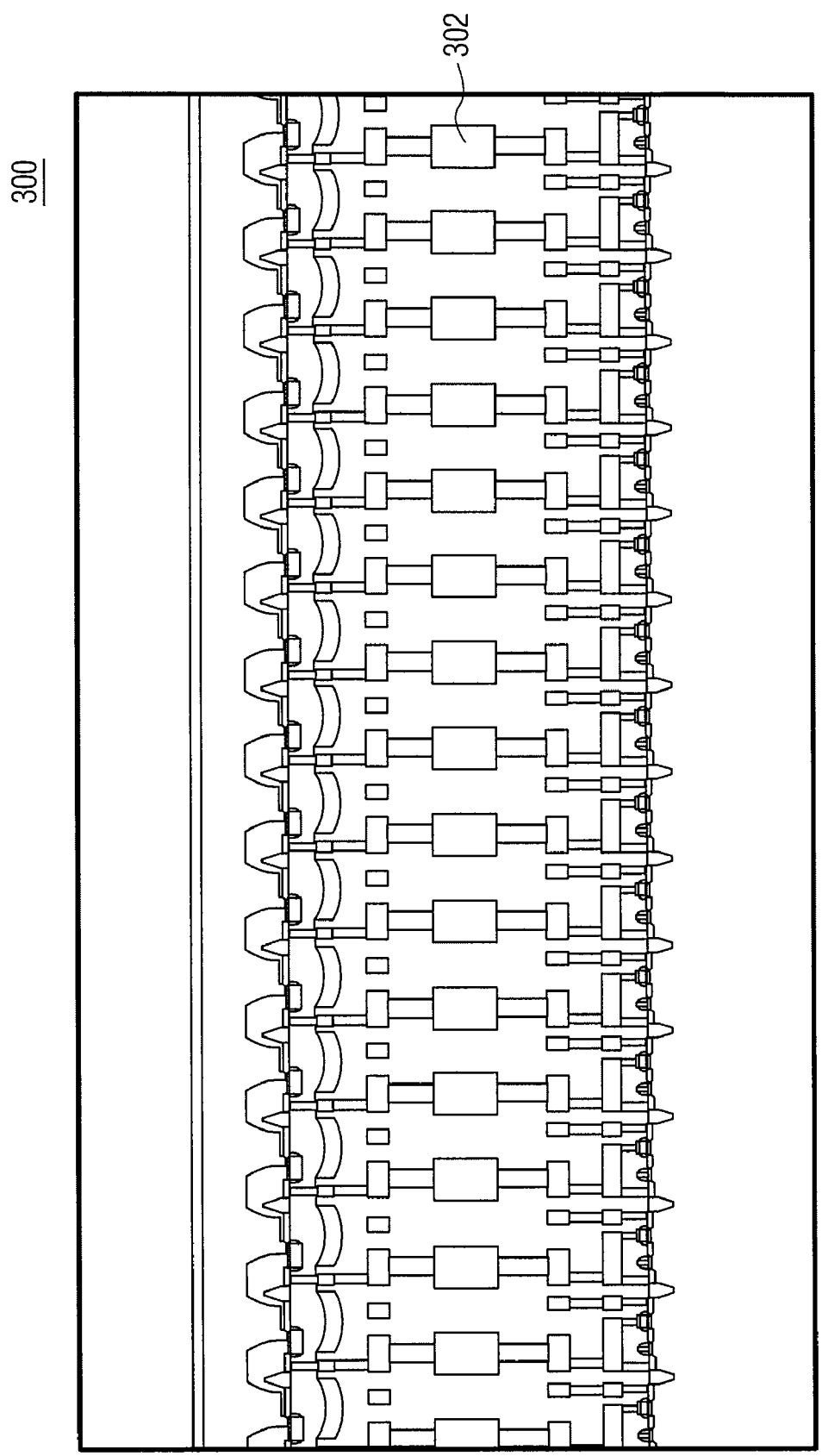
FIG. 1D is a cross-sectional view of the bonded photo-wafer of FIG. 1A and host wafer of FIG. 1B.

Next, as shown in FIGS. 1C and 1D, photo-wafer 100 and host wafer 200 may be brought together in face-to-face or infrared (IR) alignment, so that contact pads 126 of photo-wafer 100 and contact pads 226 of host wafer 200 touch. Appropriate pressure and temperature may then be applied to photo-wafer 100 and host wafer 200 so that contact pads 126 and 226 are bonded together to form respective contact pads 302. A benzocyclobutene (BCB) bonding process may used, for example. According to one example process, the wafers may be coated with a thin layer of BCB. The BCB may be etched to expose the contact pads 126 and 226 and the wafer may be pressed together with a pressure of between 1.5 and 2.5 bar for approximately one hour at a temperature of between 200 degrees Celsius and 300 degrees Celsius. After bonding, the wafers are permanently joined at contact pads 302 to form wafer 300. In this way, isolated electrical contacts may be formed through each mated pair of contact pads.

Figure 1E:
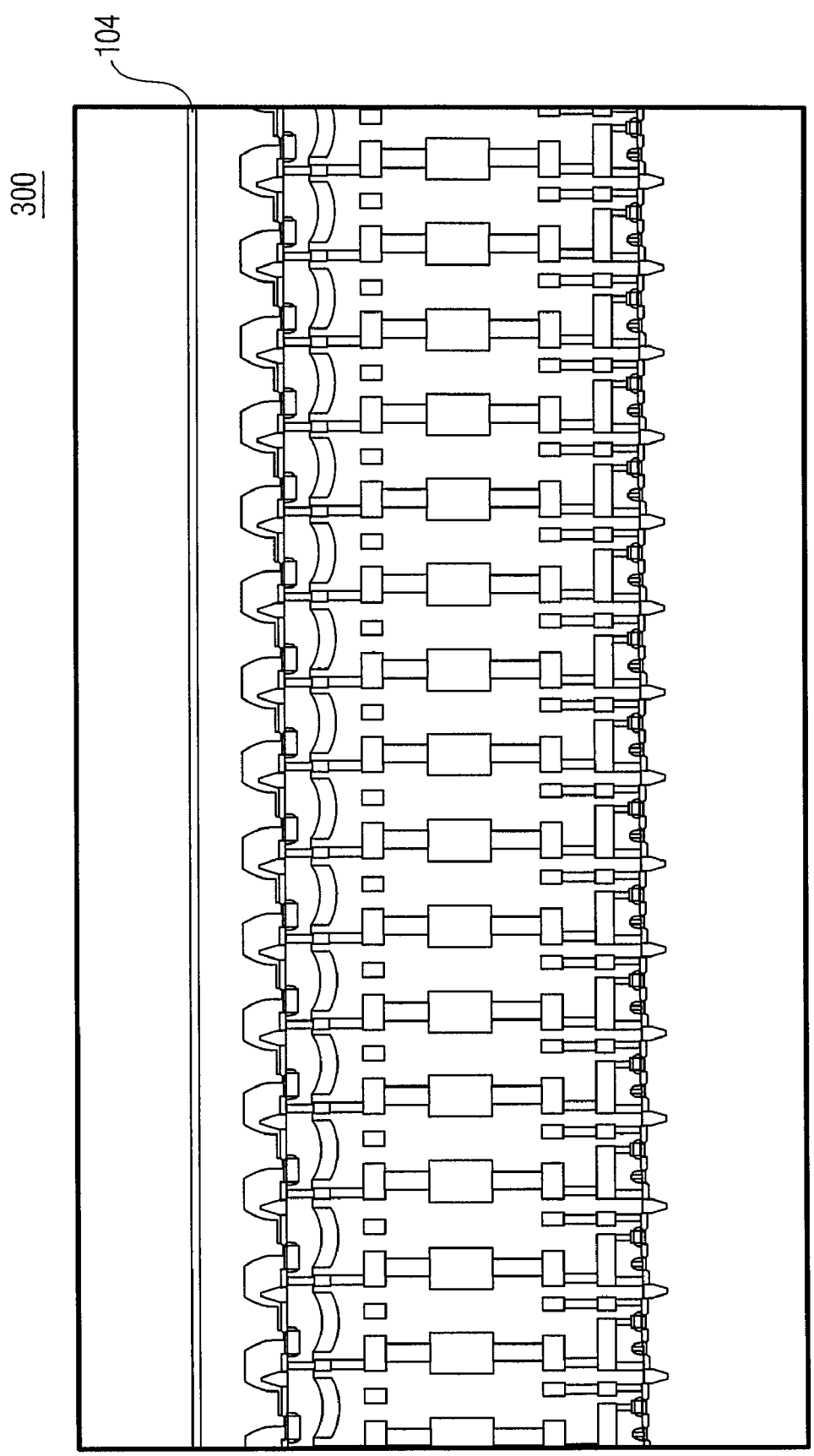
FIG. 1E is a cross-sectional view of the bonded wafer shown in FIG. 1D with a substrate of the wafer removed.

Next, substrate 102 of the original photo-wafer 100 may be removed down to etchstop 104, as shown in FIG. 1E. The substrate removal may be accomplished using a combination of grinding and/or chemical etching, with physical support provided by the host wafer. If desirable, etchstop 104 may also be removed at this point by chemical etching. Any suitable etchstop may be used.

Figure 1F:
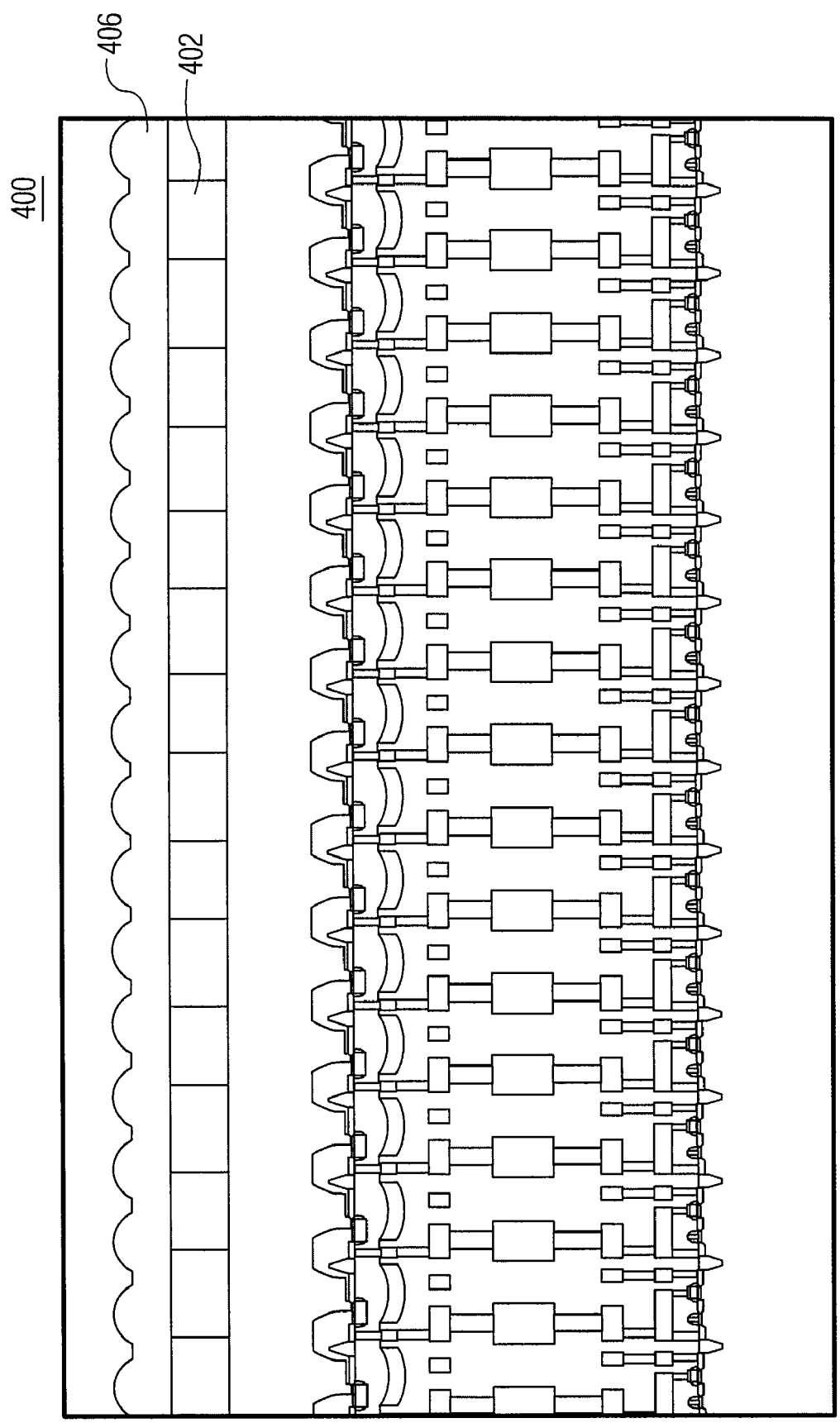
FIG. 1F is a cross-sectional view of the bonded wafer shown in FIG. 1E completed through filter attachment.

Next, as shown in FIG. 1F, after removing substrate 102, passivation and annealing of semiconductor wafer 300 may be performed (not shown). Then, color filter array 402 may be formed on wafer 300, as shown in FIG. 1F. Each color filter in the array corresponds to a pixel formed on wafer 300. Color filter array 402 may include different single color filters, each adapted to pass one band of wavelengths of the incident light. Thus, each pixel exposed to incident light may produce a signal proportional to the intensity of a particular color of light.

Next, as shown in FIG. 1F, an array of microlenses 406 may be formed over color filter array 402. Alternatively, microlenses may be formed as embedded lenses (not shown) under the filters. Each microlens in the example array corresponds to a pixel formed on wafer 300. The microlenses may be included, for example, if it is desirable to provide more focused incident light onto each pixel. These lenses may not be necessary, however, due to backside illuminated construction. That is, because the interconnect structures are formed below the photosensitive elements, it may not be necessary to include microlenses over the pixels in order to direct the incident light toward each pixel and away from the interconnect structures. A fully constructed 3-dimensional backside illuminated imager, which is designated as wafer 400, completed through addition of microlens array 406 is shown in FIG. 1F.

Figure 2:
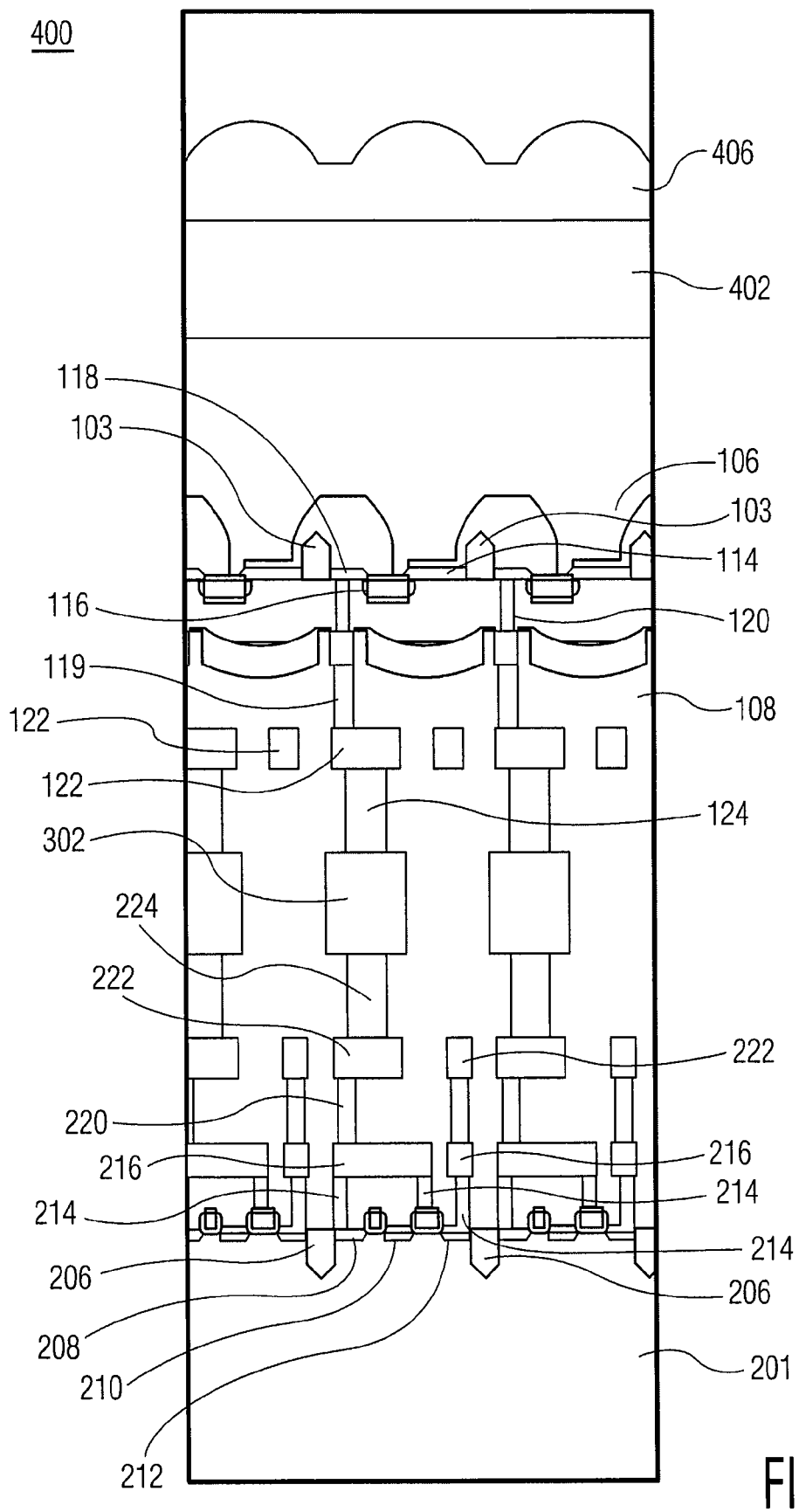
FIG. 2 is a cross-sectional view of three pixels of the completed wafer shown in FIG. 1F.

For convenience, an enlarged section of an example completed wafer 400 is shown in FIG. 2. As shown, wafer 400 includes reset transistor 208, source follower transistor 210 and row select transistor 212 formed in each pixel (or in each group of pixels) in the remaining portion of substrate 201. Individual pixels are electrically separated from adjacent pixels by shallow trench isolation regions (STIs) 103 and 206.

Reset transistor 208 is connected to floating diffusion 118 formed in transistor layer 106 by way of the metal interconnect structures including vias 214, 220, 224, 124, 119 and 120; traces 216, 222 and 122; and contact pads 302. Floating diffusion 118 is connected to photodiode 114 in transistor layer 106 via transfer gate 116. Row select transistor 212 is electrically connected to conductive traces 222 in an interconnect layer of the imager structure by way of interconnect structures including vias 214 and 220 and conductive traces 216.

The 3-dimensional structure of FIG. 2 shows each pixel in the cross-sectional view having its own associated floating diffusion region, reset transistor, source follower transistor and row select transistor. As described below with reference to FIGS. 3A, 3B, 3C and 3D, however, it will be appreciated that these transistors may be shared among a number of pixels in a 3-dimensional multiplexed backside illuminated structure.

Figure 3A:
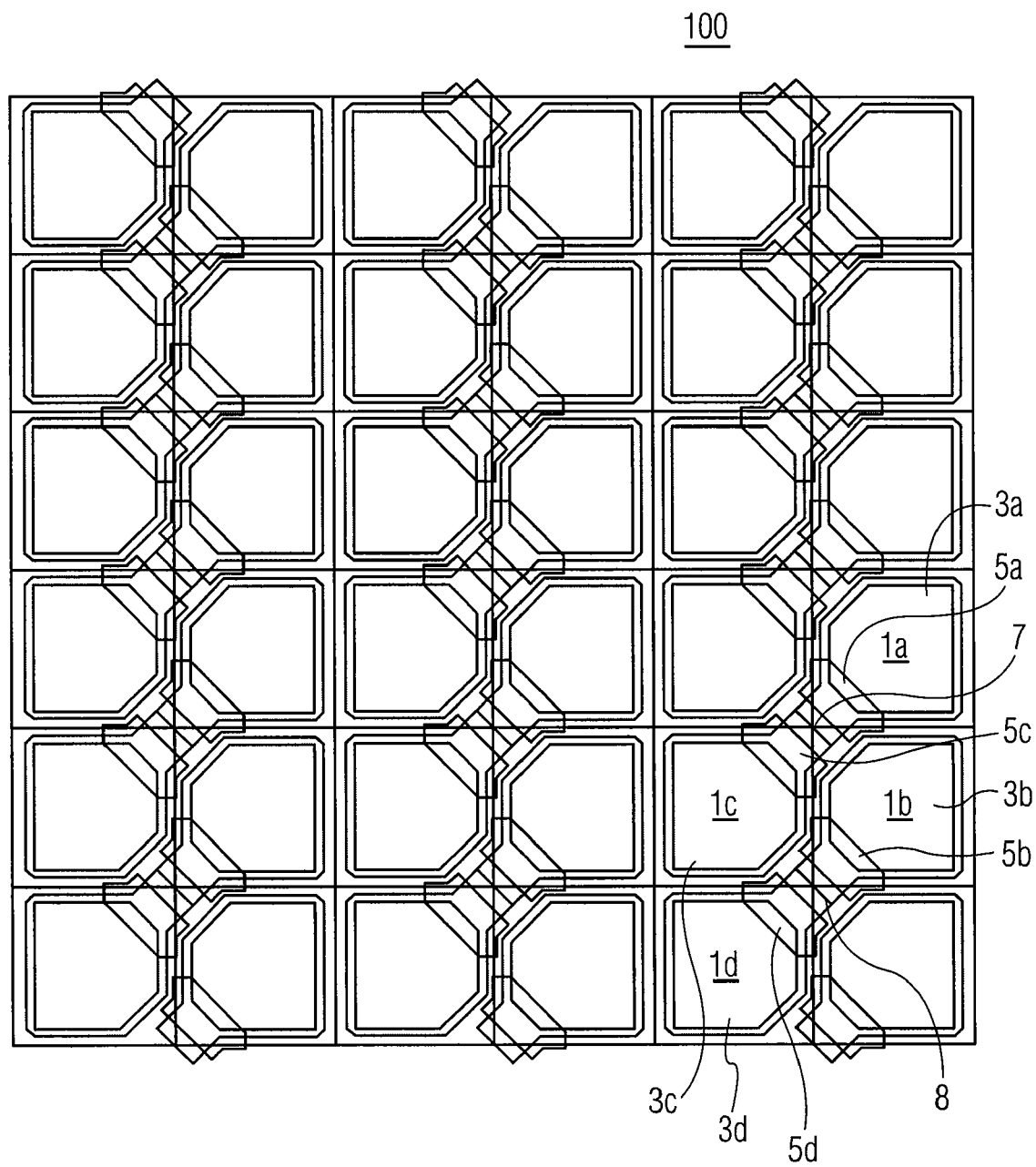
FIG. 3A is a diagram of an example 4-way multiplexed photo-wafer according to an embodiment of the present invention without the first, second and third metal layers.

FIGS. 3A-3D collectively show a build-up of photo-wafer 100 for a 3-dimensional multiplexed structure, according to an example embodiment of the present invention. As shown in FIG. 3A, photo-wafer 100 includes an array of pixels, such as pixels 1a, 1b, 1c and 1d. Each pixel 1a, 1b, 1c and 1d includes a respective photodiode 3a, 3b, 3c and 3d. Diagonal pairs of pixels 1a/1c and 1b/1d may share floating diffusions 7 and 8, respectively. Photodiodes 3a and 3c may be connected to floating diffusion 7 by respective transfer gates 5a and 5c.

Similarly, photodiodes 3b and 3d may be connected to floating diffusion 8 by respective transfer gates 5b and 5d. While in the example shown in FIGS. 3A-3D, pairs of pixels 1a/1c and 1b/1d share a floating diffusion, it will be understood that each pixel may include its own floating diffusion. Further, floating diffusions may be shared among groups of pixels in arrangements other than that shown in the example. For example, each pixel may include its own floating diffusion and multiple floating diffusions may be wired together.

Figure 3B:
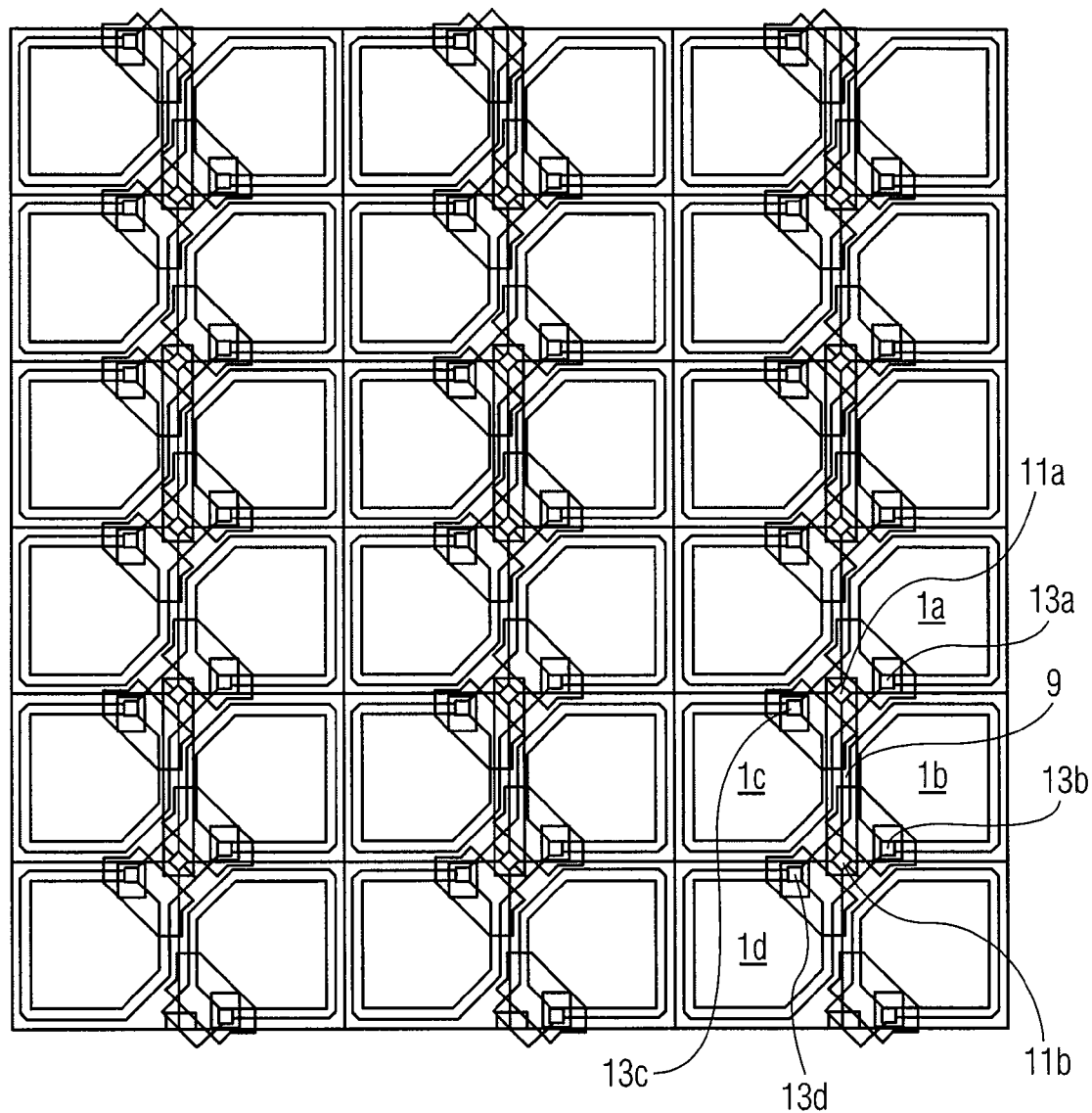
FIG. 3B is a diagram of the 4-way multiplexed photo-wafer according to the embodiment shown in FIG. 3A including the first metal layer.

FIG. 3B shows the same structure shown in FIG. 3A with an added first metal layer. In this example, floating diffusions 7 and 8 (shown in FIG. 3A) may be strapped together by a trace 9 of the first metal layer. This trace may be connected to the floating diffusions by contacts 11a and 11b formed in floating diffusions 7 and 8, respectively. Vias 13a, 13b, 13c and 13d through the first dielectric layer, filled with metal of the first metal layer, make contact with each respective transfer gate. These vias are used, as described below, to connect the transfer gates to transfer gate lines. Vias 13a, 13b, 13c and 13d correspond to vias 119 and traces 9 correspond to traces 121 shown in FIG. 1A, for example.

Figure 3C:
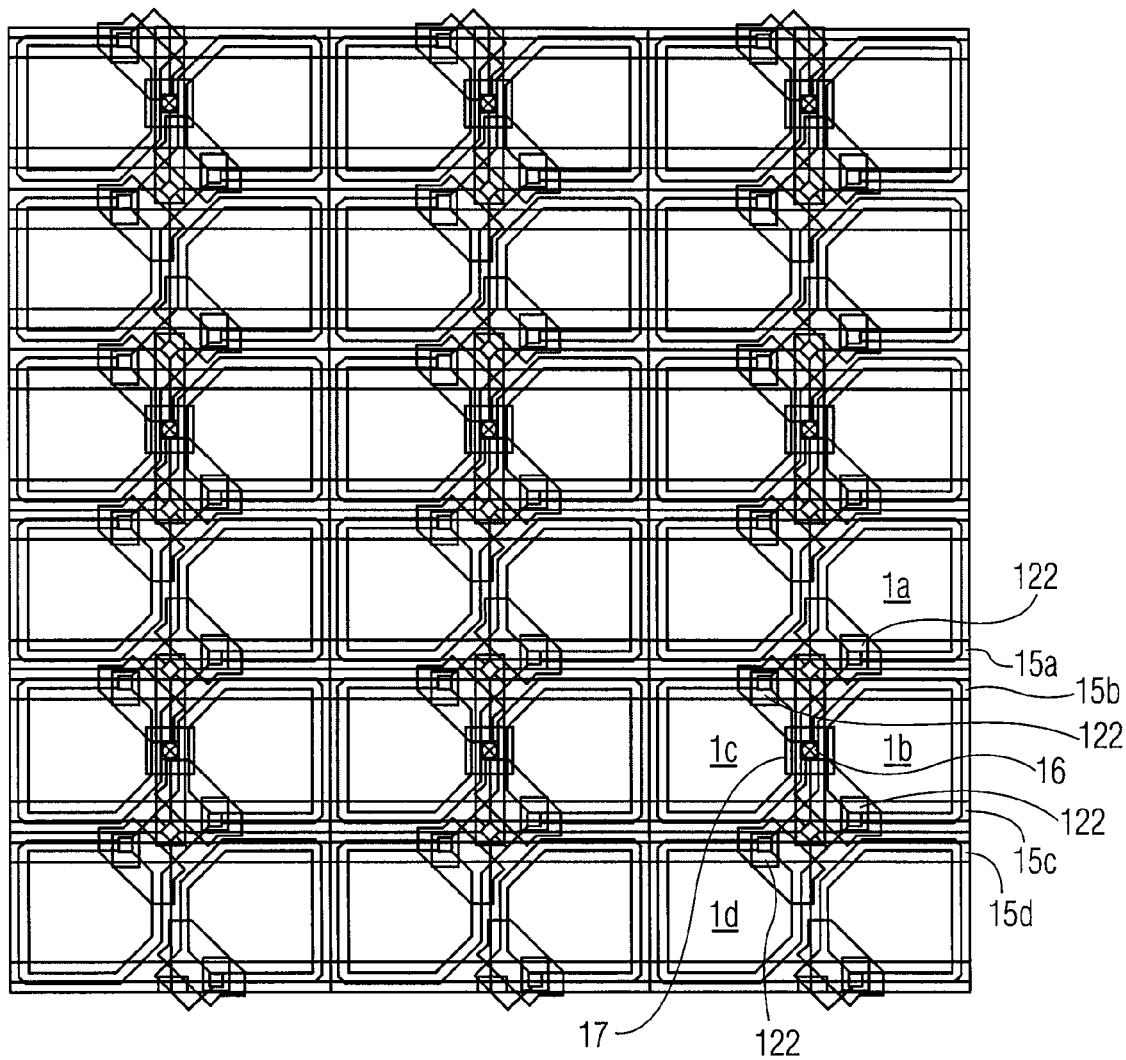
FIG. 3C is a diagram of the 4-way multiplexed photo-wafer according to the embodiment shown in FIG. 3B including the first and second metal layers.

FIG. 3C shows the structure of FIG. 3B with an added second metal layer. In this example, transfer gate lines 15a, 15b, 15c and 15d are added for pixels 1a, 1b, 1c and 1d, respectively, and are connected to each respective transfer gate 5a, 5b, 5c and 5d by the vias in the first and second dielectric layer formed from metal of the first and second metal layers. A third dielectric is formed over the transfer gate lines 15a, 15b, 15c and 15d and via holes are formed in the third dielectric as contacts 16. Contacts 16 may provide landing pads 122 for via holes 124 (shown in FIGS. 1A-1F). The second metal layer may also be formed over trace 9 in a via hole (not shown in FIGS. 1A-1F). Further, contact pad 17 may be disposed over via hole 16.

Figure 3D:
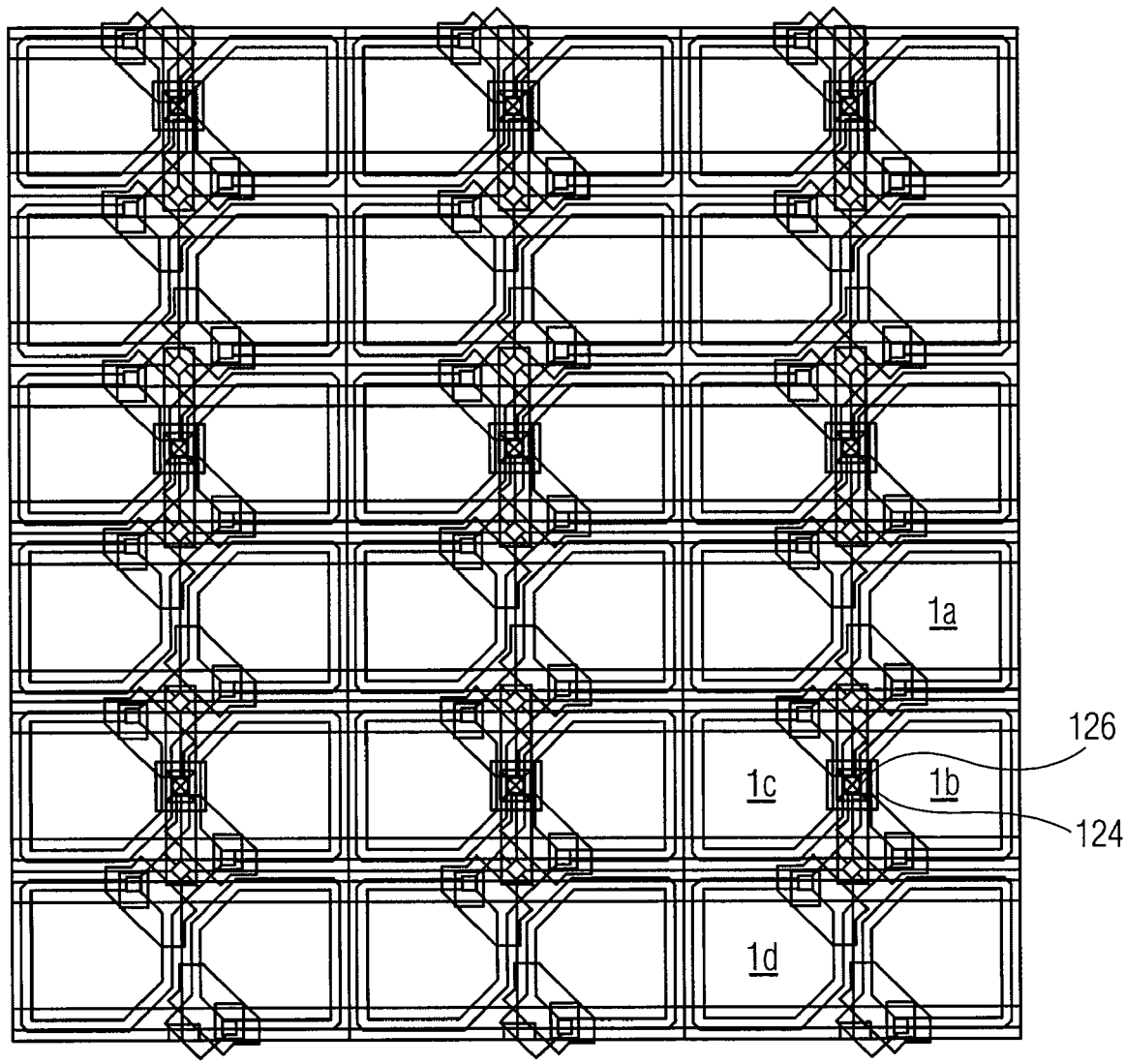
FIG. 3D is a diagram of the 4-way multiplexed photo-wafer according to the embodiment shown in FIG. 3C including the first, second and third metal layers.

FIG. 3D shows the structure shown in FIG. 3C with an added third metal layer. In this example, one contact 126 is provided for each set of multiplexed pixels. Because this example shows 4-way multiplexing, one contact 126 is provided for each set of four multiplexed pixels. Contacts 126 may be formed over via holes 124 and may be used to connect photo-wafer 100 with host wafer 200, as described above with reference to FIGS. 1A-1F. Transfer gate control lines may be connected to the host wafer through other peripheral third metal layer pads (not shown).

The example shown in FIGS. 3A-3D is a four-way multiplexed pixel array. That is, the floating diffusions of groups of four pixels are strapped together and shared. Further, groups of four pixels share a common reset transistor, source follower transistor and read out transistor in the host wafer (not shown in FIGS. 3A-3D).

The operation of pixel 1a in the example of a 4-way multiplexed structure is now described with reference to FIGS. 3A-3D. Shared floating diffusions 7 and 8 may be reset by applying a high transfer signal to transfer gate line 15a and to the shared reset transistor in the host wafer (not shown). This turns on the reset transistor and transfer gate 5a to clear charge out of photodiode 3a and shared floating diffusions 7 and 8. Photodiode 3a may then be exposed to incident light for an exposure period. Prior to reading out the level of photodiode 3a, the floating diffusions 7 and 8 may be reset and their level read out and temporarily stored for use in a CDS operation. After the reset operation, transfer gate 15a may be turned on to transfer the charge from photodiode 3a to the shared floating diffusions 7 and 8. The stored charge may then be read out using the shared output line 126. The read out value may also be temporarily stored for use in the CDS operation.

Throughout the above processing, a low signal may be applied to transfer gate lines 15b, 15c and 15d to maintain these transfer gates in an off state. This isolates the above-described operations to pixel 1a. Similar processing may be carried out for pixels 1b, 1c and 1d, for example.

Although not shown in the FIGS., the transfer gate lines 15a, 15b, 15c and 15d may be connected to drive circuitry (not shown), which provides drive signals (high or low) to the transfer gate lines, as described above.

Figure 4:
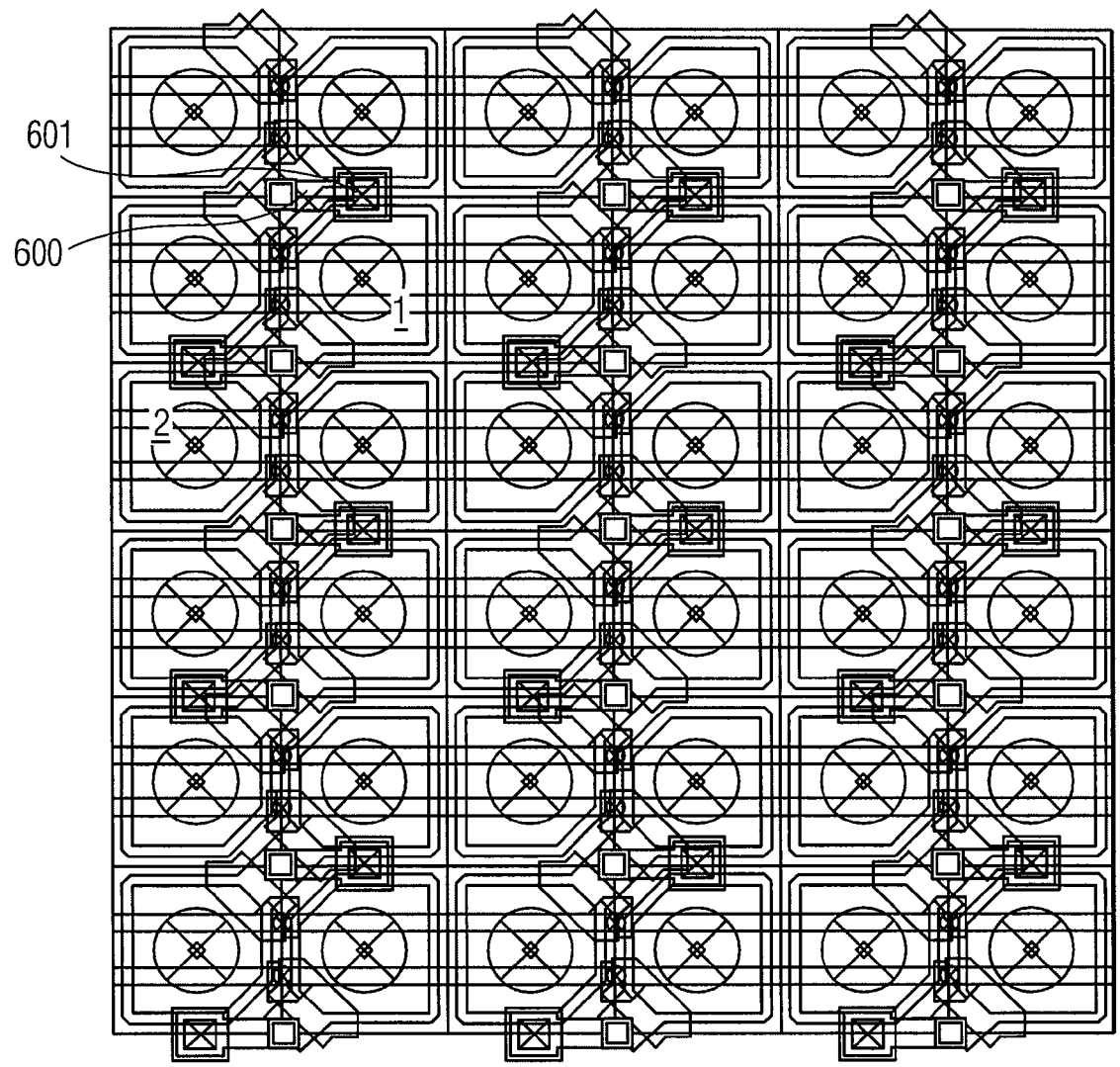
FIG. 4 is a diagram of a 2-way multiplexed photo-wafer with the first, second and third metal layers added according to an example embodiment of the present invention.
Figure 5:
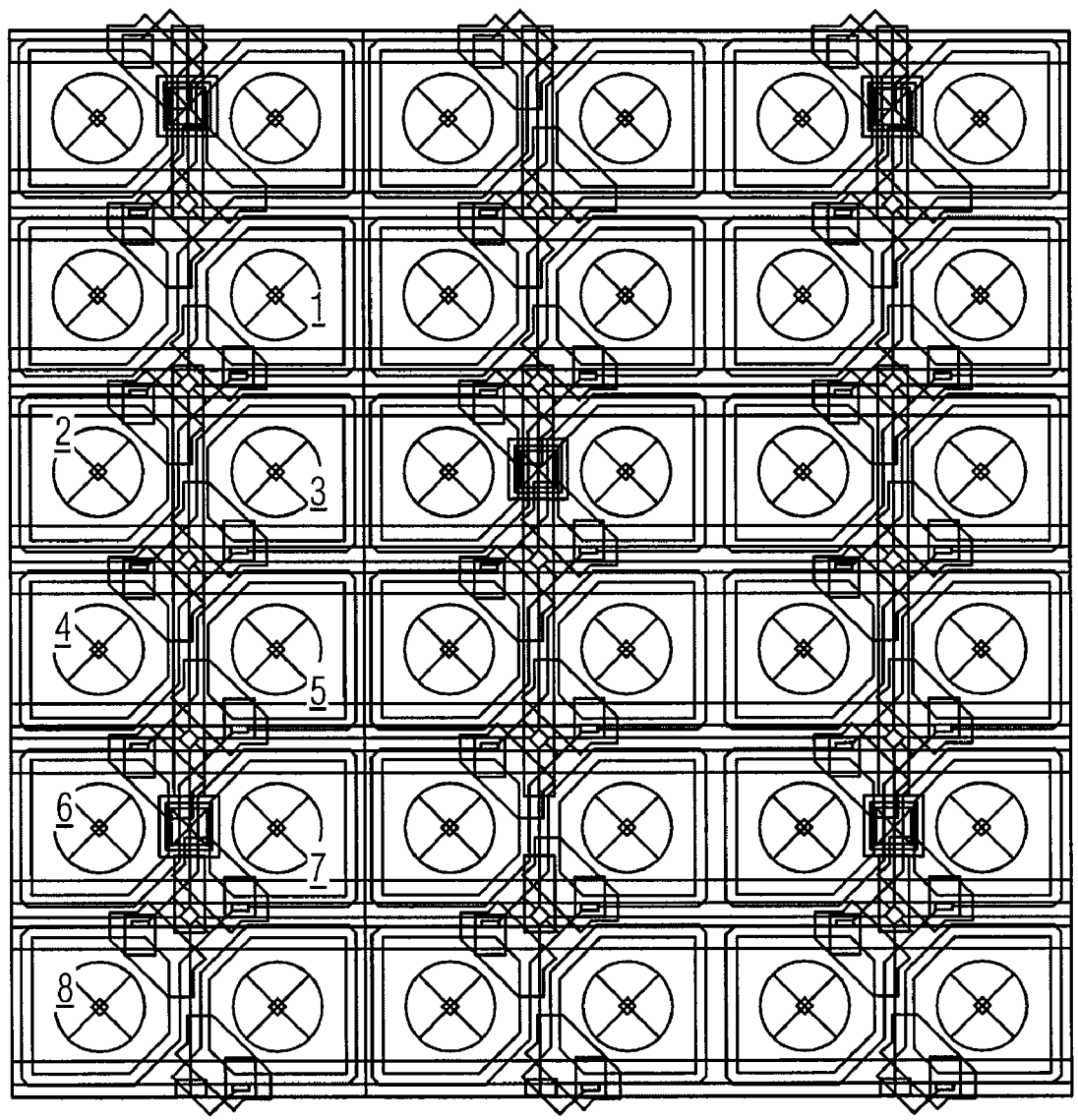
FIG. 5 is a diagram of an 8-way multiplexed photo-wafer with the first, second and third metal layers added according to an example embodiment of the present invention.
Figure 6:
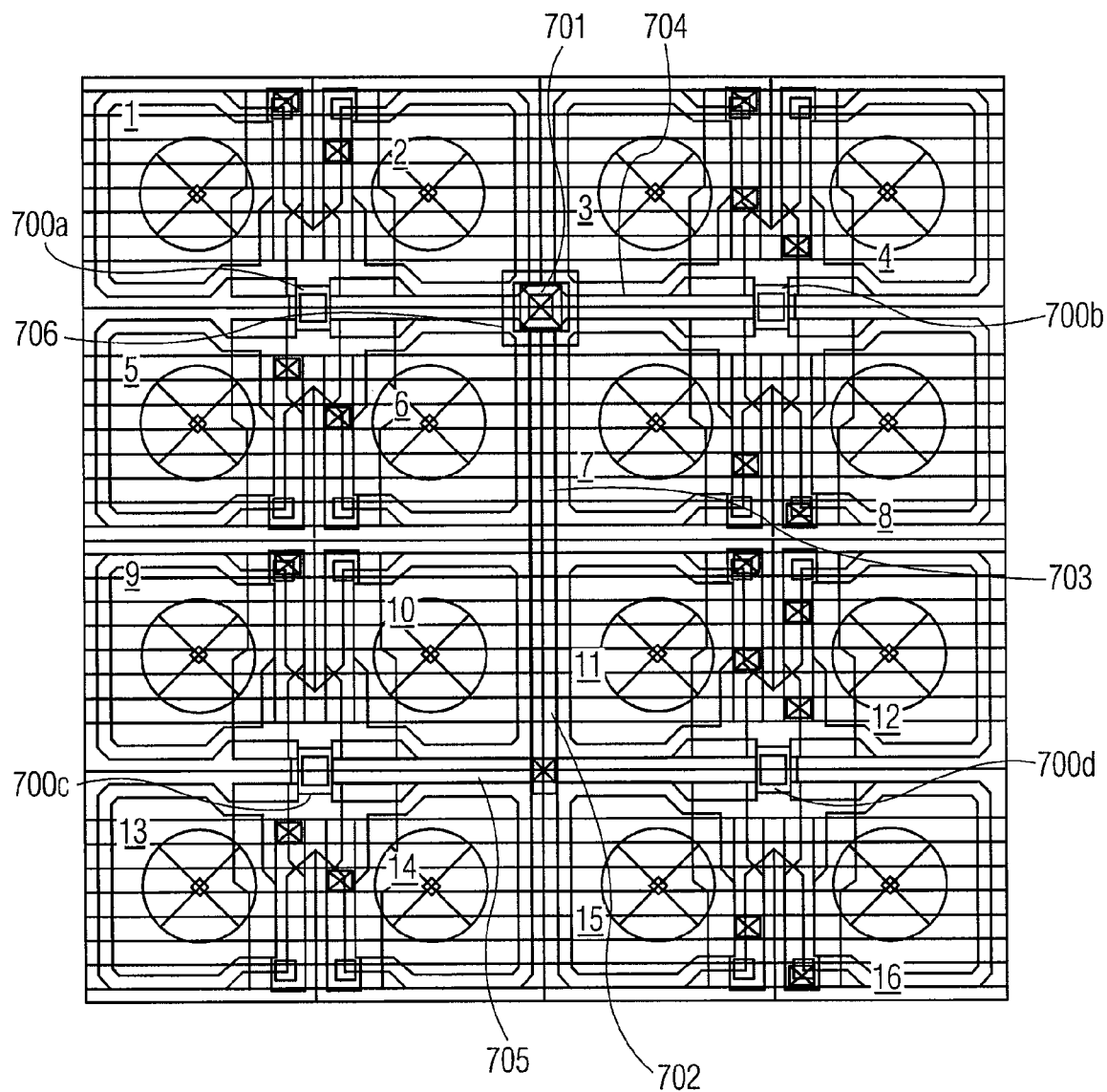
FIG. 6 is a diagram of a 16-way multiplexed photo-wafer with the first, second and third metal layers added according to an example embodiment of the present invention.

Although the example embodiment is described with reference to a 4-way multiplexed structure, different levels of multiplexing are possible consistent with the embodiments of the present invention. FIGS. 4-6, for example, show other embodiments including a two-way multiplexed structure (FIG. 4) and an eight-way multiplexed structure (FIG. 5) and a 16-way multiplexed structure (FIG. 6).

The arrangement described with respect to FIGS. 3A-3D allows for provision of only one trace and contact of the third metal layer per group of multiplexed pixels (four in the example) as opposed to one for each pixel arranged without multiplexing. The strapped-together floating diffusions of pixels or groups of pixels in the photo-wafer enables this level of multiplexing. In this way, only one trace or contact of the third metal layer may be used to connect the strapped together floating diffusions to the circuitry located in the host wafer. This reduces the alignment precision required for the wafer during the contact process. This may be particularly important when the number of contacts is a small fraction of the number of pixels, such that contacts to be bonded on each wafer are located relatively close together.

In the four-way multiplexed example shown in FIGS. 3A-3D, one contact is provided for every four pixels. This increases the space between bonding locations, allowing increased contact size and reducing the precision required for wafer to wafer bonding. As the level of multiplexing increases, for example, with the eight-way or sixteen-way multiplexing shown in FIGS. 5 and 6, the required level of precision decreases even more.

Further, as shown in FIGS. 4-6, the third metal layer contacts may be staggered. For example, in the two-way multiplexed structure of FIG. 4, second metal layer strapping, indicated by element 600, may be used to shift metal 3 contact 601 horizontally into a staggered pattern. This layout maximizes separation between required bonds such that the contacts may be made bigger, thereby ensuring electrical conduction between contacts.

With the interconnect out of the optical path in the three-dimensional structure, transfer gate control lines are not restricted by any need to route around the photodiodes; instead, transfer gate control lines may be disposed across the entire pixel width, as is most convenient. As shown in FIGS. 3D and 4-6, the arrangement of multiplexed pixels may optimize the free space within the pixel structure. As shown in FIG. 3D, for example, two transfer gate lines are included per row because each multiplexed set of four pixels spans only two columns. The same is true for the two-way multiplexed structure shown in FIG. 4 and the eight-way multiplexed structure shown in FIG. 5. For the sixteen-way multiplexed structure shown in FIG. 6, for example, four transfer gate lines are included per row because the group of multiplexed pixels span four columns. It will be appreciated, however, that the groups of multiplexed pixels may be arranged in any number of ways.

In the example of the sixteen-way multiplexed structure, the floating diffusions are strapped together differently from the two, four or eight-way multiplexed structures. In the sixteen-way structure, floating diffusions from each pixel in a group of four pixels are strapped together using traces of the first metal layer 700a, 700b, 700c and 700d, for example. In the example shown in FIG. 6, the floating diffusions of pixels 1, 2, 5 and 6 are strapped together using trace 700a, the floating diffusions of pixels 3, 4, 7 and 8 are strapped together using trace 700b, the floating diffusions of pixels 9, 10, 13 and 14 are strapped together using trace 700c and the floating diffusions of pixels 11, 12, 15 and 16 are strapped together using trace 700d. Further, first metal layer traces which join groups of pixels (e.g. traces 700a and 700b in FIG. 6) are strapped together using a trace 704 of the first metal layer. Next, a trace 703 in the second metal layer is formed to strap together the two connected groups of eight pixels, for example, traces 704 and 705 in the first metal layer are connected using trace 703 in the second metal layer. One contact 701, formed in the third metal layer, is provided per group of sixteen pixels to join the 16 strapped floating diffusions to appropriate transistors in the host wafer.

In embodiments of the present invention, the support circuitry for the photodiode and floating diffusion for the pixels is shared. As a result, there is a relatively large amount of free space in the host wafer. Referring to FIG. 6, for example, in an area occupied by 16 photodiodes in the photo-wafer, the host wafer has only two or three transistors. The free space in the host wafer may be used for other purposes, such as the addition of more transistors to each pixel set to implement more complex pixel functions, such as the creation of differential or logarithmic output signals, for example.

Figure 7:
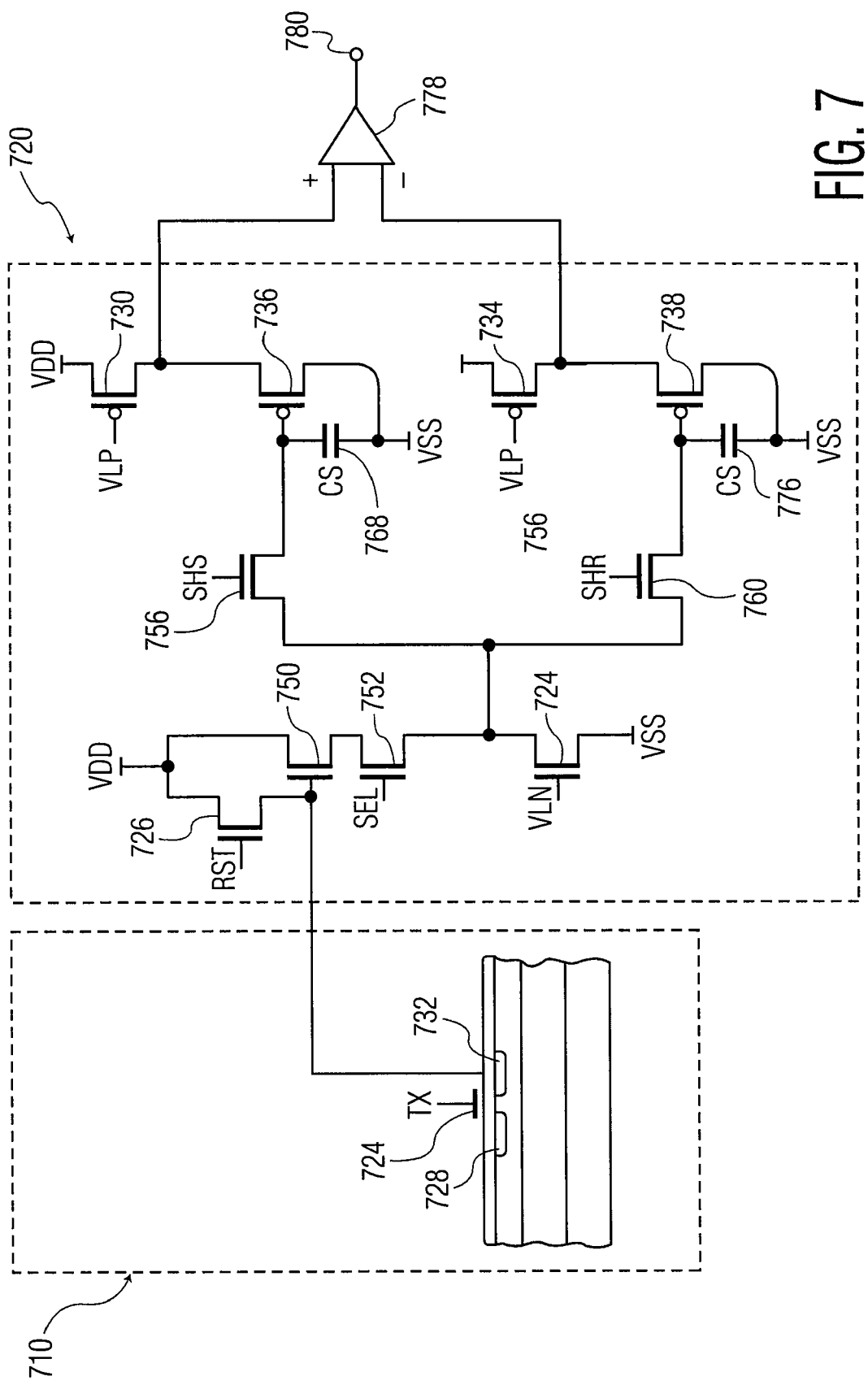
FIG. 7 is a diagram of image processing circuitry for use with any of the example embodiments of the wafers shown in FIGS. 1A-F, 2, 3A-D and 4-7.

As an additional example of the possible use of the space available on the host wafer under the photodiode array, FIG. 7 shows a circuit schematic for a typical sample-and-hold circuit with associated amplifier which may be used to perform correlated double sampling and signal amplification in a typical CMOS image sensor. The example shown in FIG. 7 includes pixel photodetector circuitry 710 in the photo-wafer and readout circuitry 720 in the host wafer. The photodetector circuitry includes photodiode 728, transfer gate 724, and floating diffusion 732. Readout circuitry 720 includes reset transistor 726, source follower transistor 750, select transistor 752, signal sample and hold transistor 756, reset sample and hold transistor 760, load transistor 724, sampling capacitors 768 and 776, output transistors 736 and 738 and load transistors 730 and 734.

Such circuitry is normally disposed along the top or bottom (or top and bottom) edges of the photodiode array, but with a highly-multiplexed three-dimensional sensor design, such circuitry may be relocated under the photodiode array, reducing the die size.

The embodiment showing CDS circuitry for a pixel group is only one example. It is contemplated that other pixel processing circuitry, such as an analog-to-digital converter, may be implemented for each pixel group. Alternatively, circuitry forming a more complex structure, (for example, the line-scanning circuitry of the imager) may be distributed across multiple pixels, with the area occupied by each readout circuit including individual transistors, coupled to transistors in other readout circuit areas to form the line-scanning circuitry.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A three-dimensional pixel array comprising:
    a plurality of groups of pixels, each group including pixels formed in the array, and comprising at least a first layer and a second layer arranged in parallel with the first layer, the first and second layers comprising respective portions of first and second semiconductor wafers, each wafer including at least two vertically separated conductive layers,
    wherein the first layer of each pixel group comprises:
        a plurality of photosensitive elements, one per pixel in the group;
        a plurality of transfer gates, one per pixel in the group;
        a plurality of floating diffusion regions, each photosensitive element in the group coupled to one of the plurality of floating diffusion regions via a respective one of the transfer gates; and
        a plurality of transfer gate lines, at least one transfer gate line being connected to each respective transfer gate in each group of pixels;
    and wherein the second layer of each pixel group comprises at least a reset transistor for each group and a source follower transistor for each group, the reset transistor and the source follower transistor in the second layer being coupled to each of the plurality of floating diffusion regions in the corresponding first layer of the pixel group.

2. The three-dimensional array of claim 1, wherein the first layer is formed on top of the second layer and, in operation, is closer to incident light than the second layer.

3. The three-dimensional array of claim 1, wherein each group comprises a number of pixels equal to a positive integer power of 2.

4. The three-dimensional array of claim 1,
    wherein the first layer is a portion of a first semiconductor wafer and the second layer is a portion of a second semiconductor wafer and the first and second semiconductor wafers are joined such that contacts coupled to the respective floating diffusions in the pixel groups of the first semiconductor wafer are coupled to respective contacts coupled to respective ones of the source follower transistors in the second semiconductor wafer.

5. A three-dimensional pixel array comprising:
    a plurality of groups of pixels, each group comprising at least two pairs of pixels and further comprising at least a first layer and a second layer, the first and second layers comprising respective portions of first and second semiconductor wafers, each wafer including at least two vertically separated conductive layers, wherein:
    each pixel comprises a respective photosensitive element formed in the first layer, and each pair of pixels in each group shares a floating diffusion region formed in the first layer,
    each group comprises a readout circuit including at least a reset transistor and a source follower transistor formed in the second layer, and
    each group comprises corresponding conductive contacts disposed in the first and second layers, each conductive contact in the second layer being coupled to a respective readout circuit, each conductive contact in the first layer being coupled to each of the floating diffusion regions in the group and the corresponding conductive contacts in the first and second layers are electrically coupled to each other.

6. The three-dimensional pixel array of claim 5, wherein each of the pairs of pixels comprise two pixels that are diagonal to each other in the array.

7. The three dimensional pixel array of claim 6, wherein the shared floating diffusions of at least four pairs of pixels are coupled together such that the group of pixels comprises eight pixels and such that four shared floating diffusions are coupled to one of the conductive contacts in the first layer.

8. The three dimensional pixel array of claim 5, wherein the two shared floating diffusions are coupled by a conductive trace formed in a column direction of the pixel array and are coupled to the conductive contacts in the first layer.

9. The three-dimensional pixel array of claim 5, wherein:
the shared floating diffusions of the at least two pairs of pixels are coupled together by traces in a first conductive layer of the first semiconductor wafer,
and the one of the conductive contacts in the first layer is a trace in the second conductive layer of the first semiconductor wafer, coupled to the corresponding trace in the first conductive layer by a via extending between the first and second conductive layers.

10. The three-dimensional pixel array of claim 9, wherein:
the photosensitive element in each pixel is connected to its corresponding shared floating diffusion via a respective transfer gate, and
a further conductive layer between the first conductive layer and the second conductive layer includes a plurality of traces formed in a row direction of the pixel array, each trace being coupled to a respective one of the transfer gates in the pixel group.

11. The three dimensional pixel array of claim 5, wherein:
the at least two pairs of pixels in the group of pixels includes two pair of pixels having a shared floating diffusion, and
the shared floating diffusions of four groups of pixels are coupled together and coupled to a respective one of the first contacts such that the group of pixels includes at least 16 pixels.

12. A three-dimensional pixel array comprising:
a plurality of groups of pixels, each group comprising at least one pair of pixels and further comprising at least a first layer and a second layer, wherein:
each pixel comprises a respective photosensitive element formed in the first layer, and each pair of pixels in each group shares a floating diffusion region formed in the first layer,
each group comprises a readout circuit including at least a reset transistor and a source follower transistor formed in the second layer, and
each group comprises corresponding conductive contacts disposed in the first and second layers, each conductive contact in the second layer being coupled to a respective readout circuit, each conductive contact in the first layer being coupled to at least one respective shared floating diffusion and the corresponding conductive contacts in the first and second layers are electrically coupled to each other,
wherein the conductive contacts of the first and second layers are staggered such that adjacent conductive contacts are not aligned in either a row direction or a column direction of the pixel array.

13. An imager comprising:
a plurality of pixels formed in a pixel array and arranged into a plurality of groups, each group comprising at least a first layer and a second layer, the first and second layers comprising respective portions of first and second semiconductor wafers, each wafer including at least two vertically separated conductive layers,
wherein the first layer of each group comprises:
a plurality of photosensitive elements, one per pixel in each group;
a plurality of floating diffusion regions, each photosensitive element in each group connected to one of the plurality of floating diffusion regions via at least one respective transfer gate per pixel; and
a plurality of transfer gate lines, at least one transfer gate line connected to each respective transfer gate in each row of pixels;
and wherein the second layer of each group comprises at least a reset transistor and a source follower transistor formed in an area of the second layer corresponding to the group of pixels in the first layer, the reset transistor and the source follower transistor in the second layer being coupled to each of the plurality of floating diffusion regions in the corresponding first layer of the group.

14. The imager of claim 13, further comprising correlated double sampling (CDS) circuitry formed in respective areas of the second layer corresponding to the groups of pixels.

15. The imager of claim 13, further comprising differential output circuitry formed in respective areas of the second layer corresponding to the groups of pixels.

16. The imager of claim 13, further comprising analog to digital converters (ADCs) formed in respective areas of the second layer corresponding to the groups of pixels.

* * * * *